United States Patent [19]
Gasparovic et al.

[11] Patent Number: 6,002,595
[45] Date of Patent: *Dec. 14, 1999

[54] CABLE-TO-BOARD ASSEMBLIES

[75] Inventors: Steven Paul Gasparovic, Santa Clara, Calif.; Lee Hock Eng; Ng Lea Swee, both of Singapore, Singapore

[73] Assignees: DiCon Connectors, Inc., San Jose, Calif.; DiCon (S) PTE Ltd., Singapore

[ * ] Notice: This patent issued on a continued prosecution application filed under 37 CFR 1.53(d), and is subject to the twenty year patent term provisions of 35 U.S.C. 154(a)(2).

[21] Appl. No.: 09/152,915

[22] Filed: Sep. 14, 1998

[51] Int. Cl.⁶ ........................................................ H05K 1/11
[52] U.S. Cl. ........................ 361/803; 361/737; 361/789; 361/796; 361/826; 361/827; 439/67
[58] Field of Search ..................................... 361/737, 785, 361/789, 796, 803, 826, 827; 439/67; 174/70 R, 71 R, 72 A, 72 TR Primary Examiner—Leo P. Picard
Assistant Examiner—Phuong T. Vu
Attorney, Agent, or Firm—Beyer & Weaver, LLP

[57] ABSTRACT

A cable-to-board assembly configured to nondetachably couple wires of a cable to surface-mounted pads on a circuit board. The cable-to-board assembly includes a first nonconductive housing and a flexible board having thereon a plurality of conductive traces. The conductive traces have first ends and second ends opposite the first ends with the first ends being electrically coupled to the wires. The first nonconductive housing encapsulates a first portion of the flexible board including the first ends. The cable-to-board assembly further includes a plurality of conductive legs configured for coupling with the surface-mounted pads on the board. The plurality of conductive legs are electrically coupled to the second ends of the conductive traces. There is also included a second nonconductive housing encapsulating a second portion of the flexible board including the second ends of the conductive traces and a portion of the conductive legs.

22 Claims, 4 Drawing Sheets

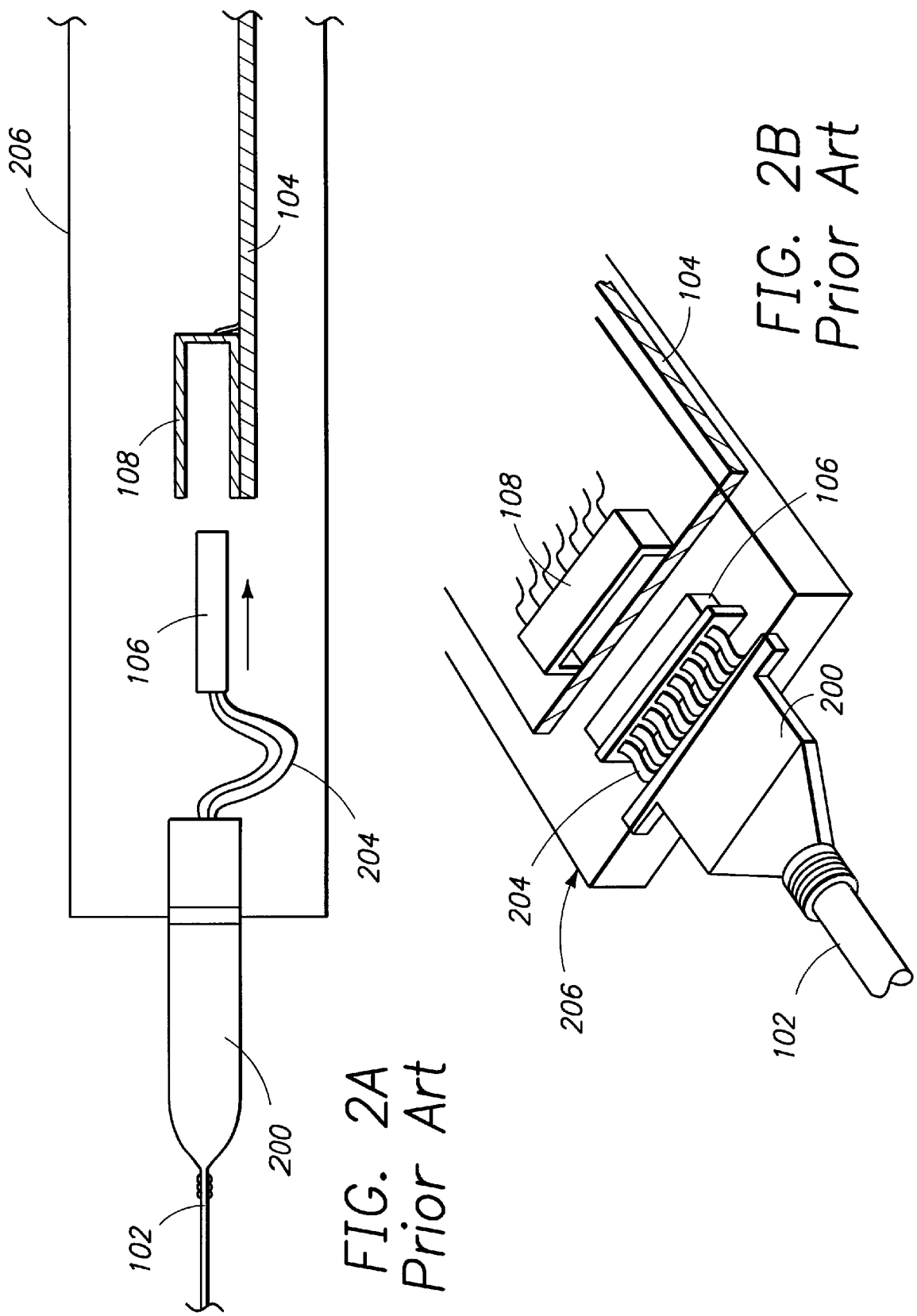

6,002,595

CABLE-TO-BOARD ASSEMBLIES

BACKGROUND OF THE INVENTION

The present invention relates to assemblies for coupling a cable to a circuit board. More particularly, the present invention relates to non-detachable cable-to-board assemblies that offer improved strain relief, reduced thickness, and simplified manufacture.

Modem electronic equipments such as computers or consumer/commercial electronics typically include one or more circuit boards on which electronic devices are populated. To furnish power and/or signals to the circuit board, one or more cables having therein one or more wires may be coupled to the circuit board. There are in the current art many techniques for connecting the wires of a cable to the circuit board. One simple technique involves manually separating, aligning, and directly soldering the individual wires of a cable with individual pads on the circuit board. There are, however, many disadvantages with this approach. By way of example, the manual separation, alignment, and soldering of individual wires with individual pads on the circuit board is a laborious and time-consuming, and therefore expensive, process. Further, as the size of the circuit board shrinks, the pads themselves and the distance that separates one pad from its neighbor also shrink, making it difficult to accurately align and solder the individual wires with the miniaturized pads. Still further, the electrical connections formed by this method tend to be unreliable since the soldered joints and the pads themselves are subjected to the mechanical stress that is generated as the cable is flexed and/or pulled during use.

To improve the mechanical strength of the coupling and improve manufacturability, connectors may be interposed between the cable and the circuit board. FIGS. 1A and 1B show a prior art technique for coupling a cable 102 to a circuit board 104 through a cable-side connector 106 and a board-side connector 108. Cable-side connector 106 is typically a plastic connector having therein a plurality of contacts. The contacts in cable-side connector 106 are soldered or crimped onto individual wires of cable 102. Similarly, board-side connector 108 includes a plurality of corresponding contacts, which are electrically coupled with pads of circuit board 104. The contacts of board-side connector 108 are configured to mate with the contacts of cable-side connector 106 when cable-side connector 106 is inserted into board-side connector 108 to form the desired electrical connections.

To relieve stress on the connectors, cable-side connector 106 may be provided with a strain-relief portion which reduces the stress experienced by the connectors when the cable is suddenly flexed during use. Cable-side connector 106 is also shown having a latch 110, which mates with a corresponding depression built into board-side connector 108 when the connectors are coupled. Latch 110 prevents the connectors from being inadvertently pulled apart when cable 102 is inadvertently pulled away from the circuit board during use. On the other hand, the connectors may be separated if latch 110 is appropriately depressed or manipulated prior to pulling the connectors apart.

Although the detachable connector assembly of FIGS. 1A and 1B represents an improvement over the above-discussed method of simply soldering the wires directly to the pads of the circuit board, there are also disadvantages. By way of example, the detachable assembly of FIGS. 1A and 1B requires two connectors, which increases cost. The use of a board-side connector 108 also increases the thickness of the cable-to-board assembly, rendering it difficult to contain the circuit board in thin cases. Further, the mating contacts within cable-side connector 106 and/or board-side connector 108 tend to be deformed, oxidized and/or contaminated with dirt over time, thereby increasing the contact resistance or in many cases, failing to maintain the electrical connections altogether. Additionally, after cable-side connector 106 is mated with board-side connector 108, there is little flexibility in the vertical direction (i.e., in the direction orthogonal to the plane of the circuit board) beyond what the strain relief may offer. The rigidity of this coupling may sometimes causes board-side connector 108 to be detached from circuit board 104 when cable 102 is flexed. This detachment may occur as the contacts of the board-side connector are separated from the pads of the circuit board. More likely, the detachment may occur as the pads themselves are lifted from the surface of the circuit board, which may break the connections between the pads and the conductive traces on the circuit board.

To address the deficiencies associated with the detachable assembly of FIGS. 1A and 1B, the connectors may of course be made non-detachable. FIGS. 2A/2B illustrate another assembly for coupling wires of a cable to pads on a circuit board wherein the coupling between the connectors is made non-detachable by the user to increase reliability. With reference to FIGS. 2A/2B, circuit board 104 is again shown connected to board-side connector 108. Cable 102 is coupled to strained relief 200, which is interpose between an opening in case 206 and cable 102 to offer some protection to components within case 206 from mechanical stress when cable 102 is flexed. Wires 204 of cable 102 is coupled to a cable-side connector 106, typically by a soldering or crimping process. With case 206 open, cable-side connector 106 is inserted in board-side connector 108 and tested to ensure that the proper electrical connections are made. Afterward, case 206 is closed, essentially preventing user access to the connectors to render them non-detachable from the user's perspective.

Although the assembly of FIGS. 2A/2B addresses many of the reliability issues associated with detachable connectors, there are also disadvantages. By way of example, the assembly of FIGS. 2A/2B requires the use of a board-side connector 108, which unnecessarily increases manufacturing cost. Further, board-side connector 108 and/ or cable-side connector 106 are physical apparatus with nontrivial heights. As electronic equipment becomes smaller and the thickness of case 206 decreases, these connectors may not fit properly within case 206. By way of example, the circuit board of PC cards (also known as PCMCIA cards) are encapsulated in shells or cases that may be as thin as 5 mm. In many cases, the use of these connectors causes bulges in the housing of the case or prevents the closing of the case altogether. This problem is exacerbated by the fact that individual wires 204 typically need to have some nontrivial minimum length for handling during the crimping or soldering operation that couples wires 204 onto cable-side connector 106. The wires 204 may then need to be coiled within case 206 prior to closing the case, further exacerbating the case protrusion problem.

In view of the foregoing, there are desired improved cable-to-board assemblies that offer improved strain relief, reduced thickness, and ease of manufacture.

SUMMARY OF THE INVENTION

The invention relates, in one embodiment, to a cable-to-board assembly configured to nondetachably couple wires of a cable to surface-mounted pads on a circuit board. The cable-to-board assembly includes a first nonconductive housing and a flexible board having thereon a plurality of conductive traces. The conductive traces have first ends and second ends opposite the first ends with the first ends being electrically coupled to the wires. The first nonconductive housing encapsulates a first portion of the flexible board including the first ends. The cable-to-board assembly further includes a plurality of conductive legs configured for coupling with the surface-mounted pads on the board. The plurality of conductive legs are electrically coupled to the second ends of the conductive traces. There is also included a second nonconductive housing encapsulating a second portion of the flexible board including the second ends of the conductive traces and a portion of the conductive legs.

In another embodiment, the invention relates to a method for nondetachably coupling wires of a cable to surface-mounted pads on a circuit board. The method includes providing a flexible board having thereon a plurality of conductive traces with the conductive traces having first ends and second ends opposite the first ends. The method also includes electrically coupling the first ends of the plurality of conductive traces to the wires. The method further includes providing a plurality of conductive legs configured for coupling with the surface-mounted pads on the board. There is also included electrically coupling the second ends of the plurality of conductive traces to the plurality of conductive legs. Additionally, there is included molding a first nonconductive housing over a first portion of the flexible board to encapsulate the first ends of the conductive traces and a portion of the wires within the first nonconductive housing. There is further included molding a second nonconductive housing over a second portion of the flexible board to encapsulate the second ends of the conductive traces and a portion of the plurality of conductive legs within the second nonconductive housing.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings, which are not drawn to scale to simplify the illustration and in which like reference numerals refer to similar elements.

FIG. 2A is a simplified side view of another prior art cable-to-board assembly.

FIG. 2B is a simplified perspective view illustration of another prior art cable-to-board assembly.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
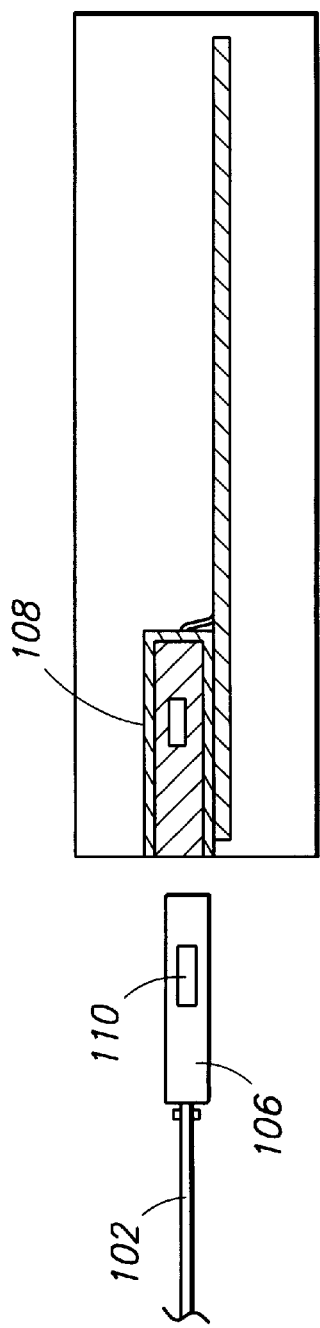
FIG. 1A is a simplified side view of a prior art cable-to-board assembly.
Figure 1B:
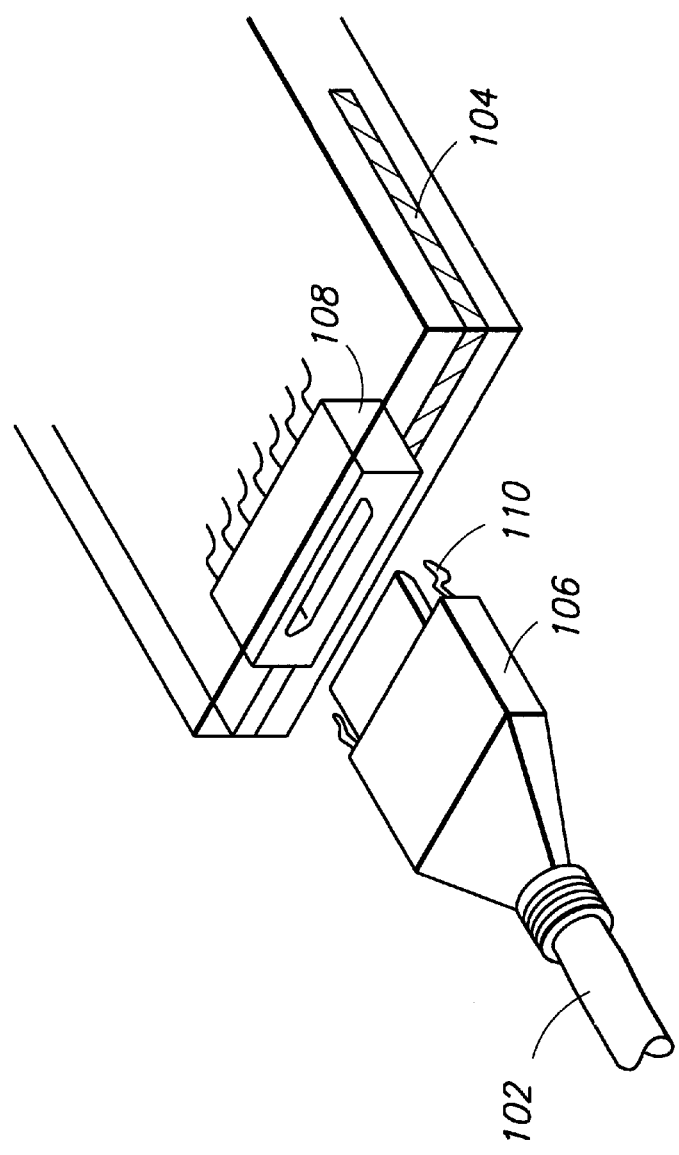
FIG. 1B is a simplified perspective view of the prior art cable-to-board assembly of FIG. 1A.

In accordance with one embodiment of the present invention, there is provided a cable-to board assembly configured to nondetachably couple wires of a cable to surface mounted pads of a circuit board. The improved cable-to-board assembly employs a flexible board having thereon a plurality of conductive traces in between the cable and the circuit board to offer high reliability, reduced height, and improved strained relief. In contrast to the implementation of FIGS. 1A/1B and FIGS. 2A/2B, there are no mating contacts that may build up contact resistance or lose electrical contact with use. Instead, the wires of the cable are soldered or crimped to the conductive traces of the flexible board, which are in turn soldered or crimped to the surface mounted pads of the circuit board to form permanent and reliable electrical connections.

Figure 3:
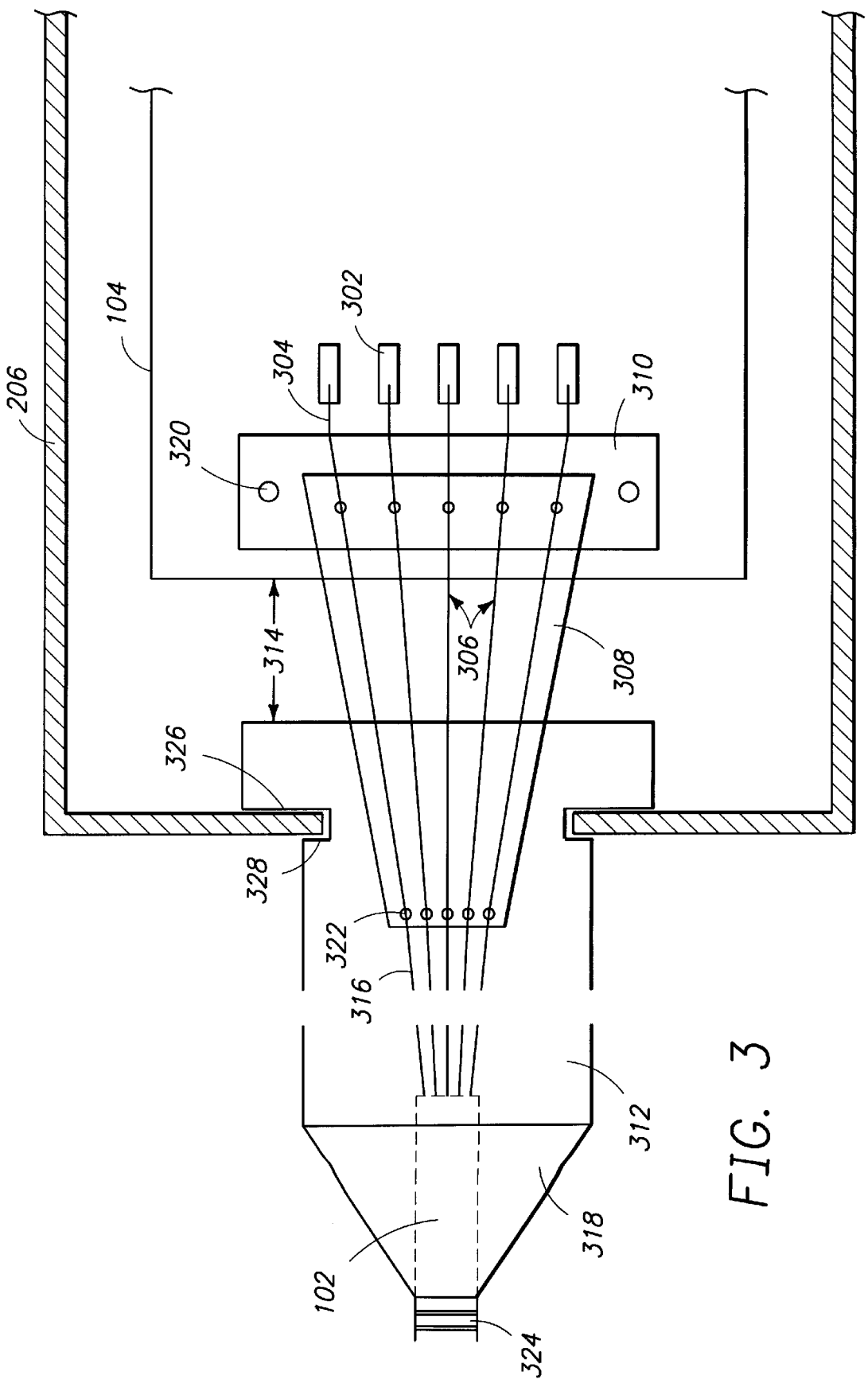
FIG. 3 is a top-view illustration of the improved cable-to-board assembly in accordance with one embodiment of the present invention.
Figure 4:
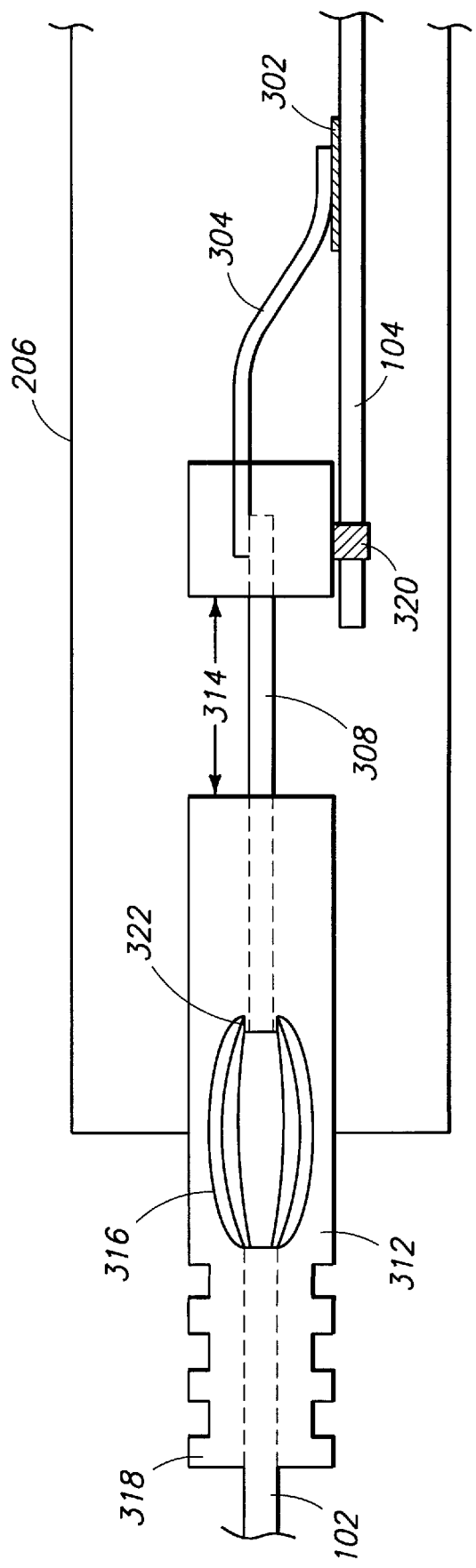
FIG. 4 is a cross-sectional view of the improved cable-to-board assembly in accordance with one embodiment of the present invention.

To further discuss the features and advantages of the present invention, FIGS. 3 and 4 illustrate, in accordance with one embodiment of the present invention, the topside and cross-sectional views of the inventive cable-to-board assembly. With reference to FIG. 3, circuit board 104 having thereon a plurality of surface mounted pads 302 is shown. Circuit board 104 is typically enclosed within a case 206 during use. Although not shown to simplify the illustration, it should be understood that there are electronic devices (such as ICs, transistors, resistors, capacitors, or the like) populated on one or both surfaces of circuit board 104. At least some of these electronic devices are typically coupled to surface mounted pads 302 via conductive paths provided on circuit board 104.

Surface mounted pads 302 of circuit board 104 are soldered to conductive legs 304 (which are more clearly shown in the cross-sectional view of FIG. 4) of the inventive cable-to-board assembly. A conductive leg 304 has two ends, one of which is soldered or crimped onto a surface mounted pad 302. The other end of the conductive leg 304 is electrically coupled with a conductive trace 306 on a flex board 308, either by direct soldering or crimping, or through an intervening lead.

A conductive trace 306 on flex board 308 also has two ends, one of which is electrically coupled to a conductive leg 304. The other end of conductive trace 306 is electrically coupled to a wire 316 of cable 102. The conductive traces may be disposed on one or both surfaces of flex board 308. In the case of a multi-layer flex board, some or all of the conductive traces (either the whole length or a portion thereof) may be disposed on one of the metal layers within the thickness of the flex board.

The electrical coupling between a conductive trace 306 and a wire 316 may be performed by a high speed soldering, crimping, or hot bar process, which is designed to form a permanent electrical connection between a conductive trace 306 of flex board 308 and a wire 316 of cable 102. As can be appreciated from the foregoing, a conductive path is formed through permanent electrical connections between a wire 316, a conductive trace 306 of flex board 308, a conductive leg 304, and a surface mounted pad 302 of circuit board 104.

A housing 310, which is preferably formed of moldable plastic (e.g., PBT, PVC or a similarly suitable plastic compound), is provided to encapsulate a portion of conductive legs 304 as well as a portion of flex board 308. Typically, housing 310 is molded over a portion of flex board 308 and a portion of conductive legs 304 after the electrical connections are made between conductive legs 304 and conductive traces 306 on flex board 308 (but preferably before the conductive legs are soldered to the surface mounted pads on the circuit board). This housing 310 essentially holds the electrical connections immobile and provides additional mechanical strength to the connections.

Housing 310 also helps maintain the regular spacing between adjacent ones of conductive legs 304 as well as ensuring planarity of the conductive legs for the subsequent soldering operation. Because the regular spacings and planarity conductive legs 304 are maintained by housing 310, it is possible to align at once all conductive legs 304 with their conductive pads on the circuit board for soldering. In other words, the process of aligning individual ones of conductive legs 304 with individual ones of surface mounted pads 302 during the subsequent soldering process is no longer necessary. In this manner, housing 310 renders it possible to employ high speed automated soldering process to attach conductive legs 304 with their corresponding surface mounted pads on the circuit board.

Another housing 312, also preferably formed of moldable plastic (e.g., PVC or a similarly suitable plastic compound), encapsulates wires 316 and at least a portion of flex board 308. Typically, housing 312 is molded over a portion of flex board 308 and wires 316 after the electrical connections are made between wires 316 and conductive traces 306 on flex board 308. Preferably, housing 312 encapsulates the connections between wires 316 and conductive traces 306 of flex board 308 to hold these connections immobile and to provide additional mechanical strength to the connections. As can be appreciated by those skilled in the art, the fact that housings 310 and 312 are molded over the electrical connections means that when cable 102 is inadvertently pulled during use, the strain that is caused thereby is advantageously borne by the housings and the material of flex board 308, not by the electrical connections that are encapsulated in the housings or by the conductive traces disposed on the surface(s) of flex board 308. Since housing 310 and 312 permanently encapsulate the connections, they do not require subsequent manual handling or the stress that is caused by such manual handling, and can be therefore made thinner than the connectors of prior art cable-to-board assemblies, thereby advantageously allows the assembly to fit within thinner cases.

As shown, housing 310 and 312 are preferably separated by a gap 314. The portion of flex board 308 in this gap 314 is therefore thinner than the thickness of either housing 310 or 312. Thus, this portion of flex board 308 in gap 314 remains more flexible, advantageously providing additional strain relief when cable 102 is flexed during use.

In accordance with one embodiment of the present invention, flex board 308 may be manufactured in accordance with conventional printed circuit board (PCB) manufacturing methods, and may have multiple layers. The thickness of flex board 308 may be varied to suit the needs of different assemblies. Flex board 308 should be sufficiently thick and/or formed with a suitable material to withstand the pressure and heat of the molding process that forms housings 310 and 312. Flex board 308 should also be sufficiently thick to withstand the stress and/or heat of the soldering or crimping operations that couple the wires and/or the conductive legs to the conductive traces on the flex board. However, the thickness of flex board 308 should be moderated by the need for flex board 308 to flex during use to absorb stress. By way of example, a flex board having a thickness of about 0.8 mm has been found to be suitable for use with circuit boards in PC cards.

A wing ear portion 318, which may be integral with housing 312 or may be a separate part affixed to housing 312, may be furnished to provide additional strain relief. As clearly shown in FIG. 3, wing ear portion 318 prevents the assembly from being pulled out of the case when cable 102 is pulled. Surface 326 of wing ear portion 318 also acts cooperatively with surface 328 of housing 312 to form a channel or recess, which secures the edge of case 206 when the shell halves are closed. In this manner, the entire cable-to-board assembly is rigidly held relative to the opening in the shell, thereby relieving components within the shell from mechanical stress when cable 102 is flexed during use. Further, mechanical stress is absorbed by flex board 308, thereby further reducing the possibility of breaking the electrical connections between conductive legs 304 and surface mounted pads 302 and/or breaking surface mounted pads 302 from circuit board 104.

Housing 310 is shown with alignment pegs 320, which are essentially protrusions from housing 310 that are configured to mate with corresponding openings in circuit board 104. Alignment pegs 320 and the corresponding openings in circuit board 104 are positioned such that when alignment pegs 320 are inserted into their corresponding openings in circuit board 104, conductive legs 304 which protrude from housing 310 are automatically aligned with surface mounted pads 302 on circuit board 104. In this manner, alignment pegs 320 aids in the manufacturing process by making it possible to rapidly align conductive legs 304 with surface mounted pads 302 on circuit board 104 for soldering.

Alignment pegs 320 also adds mechanical strength to the cable-to-board assembly by allowing housing 310 and the body of circuit board 104 to absorb most the strain if cable 102 is inadvertently pulled away from circuit board 104 during use. If alignment pegs 320 were not provided, the strain may break the connections between conductive legs 304 and surface mounted pads 302, or cause surface mounted pads 302 to be ripped away from the surface of circuit board 104. For additional resistance to pulling, wires 316 may be bent within housing 312 or case 206. Additionally or alternatively, flex board 308 may be provided with notches or shoulders within the encapsulated portion(s) to allow flex board 308 to better resist being pulled apart from housing 312 and/or housing 310.

As can be appreciated from the foregoing, the inventive cable-to-board assembly advantageously offers improved strain relief, reduced height, and simplified manufacturing. Strain relief is improved since cable strain relief 324, wing ear portion 318 and flex board 308 flex to absorb the strain and stress when cable 102 is moved during use. In one example, a cable-to-board assembly utilizing the flex board described herein successfully withstood a bend test that consists of about 200,000 flexes along the X and Y axis alternately. Strain relief is also enhanced since housings 310 and 312 and the body of flex board 308 absorb most of the strain when cable 102 is inadvertently pulled during use. In another example, a cable-to-board assembly utilizing the flex board described herein withstood 195 lbs of pull on the cable without failure.

The elimination of the connectors, in addition to reducing cost, also allows the assemblies to be made thinner to fit within small cases. The use of flex board 308 to interface between cable 102 and circuit board 104 advantageously simplifies manufacturing since high speed manufacturing techniques which have been developed for connecting wires to board can be employed to advantage. As mentioned earlier, the use of alignment pegs, as well as the prealignment of conductive legs in housing 310 allows the conductive legs to be aligned with and soldered onto the surface mounted pads on circuit board 104 in a high speed and automated manner. All these contribute to a robust and inexpensive cable-to-board assembly that is highly suitable for use in modern electronic equipment.

While this invention has been described in terms of several preferred embodiments, there are alterations, permutations, and equivalents which fall within the scope of this invention. By way of example, although a gap 314 is shown between housing 310 and housing 312, it is possible to form housing 310 and 312 integrally and leaves no gap, e.g., by molding both out of a plastic or insulating material having a suitable thickness and resiliency and that covers the entire upper and/or lower surface of the flex board. The inherent resiliency of the plastic material would still allow the flex board to flex within the plastic material, thereby still offering the flexible advantage of the present invention (and additionally providing electrical shielding for surface-oriented traces 306 if they are disposed on the surfaces of the flex board). It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A cable-to-board assembly which nondetachably couples wires of a cable to surface-mounted pads on a circuit board, comprising:
    a first nonconductive housing;
    a flexible board having thereon a plurality of conductive traces, said conductive traces having first ends and second ends opposite said first ends, said first ends being electrically coupled to said wires, said first nonconductive housing encapsulating a first portion of said flexible board including said first ends;
    a plurality of conductive legs coupling with said surface-mounted pads on said circuit board, said plurality of conductive legs being electrically coupled to said second ends of said conductive traces; and
    a second nonconductive housing encapsulating a second portion of said flexible board including said second ends of said conductive traces and a portion of said conductive legs.

2. The cable-to-board assembly of claim 1 wherein said second portion being spaced apart from said first portion to allow at least a third portion of said flexible board to remain flexible when said first portion is flexed relative to said second portion.

3. The cable-to-board assembly of claim 1 wherein at least one of said first nonconductive housing and said second nonconductive housing is molded onto said flexible board during manufacture of said cable-to-board assembly.

4. The cable-to-board assembly of claim 1 wherein both of said first nonconductive housing and said second nonconductive housing are molded onto said flexible board during manufacture of said cable-to-board assembly.

5. The cable-to-board assembly of claim 1 wherein said second nonconductive housing includes alignment pegs configured for aligning said second nonconductive housing to corresponding holes in said circuit board, said aligning causing said conductive legs to align with said surface-mounted pads for soldering.

6. The cable-to-board assembly of claim 5 wherein said conductive traces are disposed on both sides of said flexible board.

7. The cable-to-board assembly of claim 1 wherein said circuit board represents a PC card circuit board.

8. The cable-to-board assembly of claim 7 wherein said second nonconductive housing is disposed in a case that encloses said PC card circuit board.

9. A cable-to-board assembly which nondetachably couples wires of a cable to surface-mounted pads on a circuit board, comprising:
    flexing means having thereon a plurality of conductive traces, said conductive traces having first ends and second ends opposite said first ends, said first ends being electrically coupled to said wires;
    first encapsulating means for encapsulating a first portion of said flexing means including said first ends of said conductive traces and a portion of said wires;
    a plurality of conducting means soldered with said surface-mounted pads on said circuit board, said plurality of conducting means being electrically coupled to said second ends of said conductive traces; and
    a second encapsulating means encapsulating a second portion of said flexing means including said second ends of said conductive traces and a portion of said plurality of said conducting means.

10. The cable-to-board assembly of claim 9 wherein said second portion being spaced apart from said first portion to allow at least a third portion of said flexing means to remain flexible when said first portion is flexed relative to said second portion.

11. The cable-to-board assembly of claim 9 wherein at least one of said first encapsulating means and said second encapsulating means is molded onto said flexing means during manufacture of said cable-to-board assembly.

12. The cable-to-board assembly of claim 9 wherein both of said first encapsulating means and said second encapsulating means are molded onto said flexing means during manufacture of said cable-to-board assembly.

13. The cable-to-board assembly of claim 9 wherein said second encapsulating means includes alignment pegs configured for aligning said second encapsulating means to corresponding holes in said circuit board, said aligning causing said conducting means to align with said surface-mounted pads for soldering.

14. The cable-to-board assembly of claim 13 wherein said conductive traces are disposed on both sides of said flexing means.

15. The cable-to-board assembly of claim 9 wherein said circuit board represents a PC card circuit board.

16. The cable-to-board assembly of claim 15 wherein said second encapsulating means is disposed in a case that encloses said PC card circuit board.

17. A method of nondetachably coupling wires of a cable to surface-mounted pads on a circuit board, comprising:
    providing a flexible board having thereon a plurality of conductive traces, said conductive traces having first ends and second ends opposite said first ends;
    electrically coupling said first ends of said plurality of conductive traces to said wires;
    providing a plurality of conductive legs, said plurality of conductive legs coupling with said surface-mounted pads on said board;

electrically coupling said second ends of said plurality of conductive traces to said plurality of conductive legs;

molding a first nonconductive housing over a first portion of said flexible board which encapsulates said first ends of said conductive traces and a portion of said wires within said first nonconductive housing;

molding a second nonconductive housing over a second portion of said flexible board which encapsulates said second ends of said conductive traces and a portion of said plurality of conductive legs within said second nonconductive housing.

18. The method of claim 17 wherein said second portion is spaced apart from said first portion to allow at least a third portion of said flexible board to remain flexible when said first portion is flexed relative to said second portion.

19. The method of claim 17 wherein said molding said second nonconductive housing includes forming alignment pegs on one surface of said nonconductive housing, said alignment pegs being configured for aligning said second nonconductive housing to corresponding holes in said circuit board, said aligning causing said conductive legs to align with said surface-mounted pads for soldering.

20. The method of claim 19 wherein said conductive traces are disposed on both sides of said flexible board.

21. The method of claim 17 wherein said circuit board represents a PC card circuit board.

22. The method of claim 21 wherein said second nonconductive housing is disposed in a case that encloses said PC card circuit board.

* * * * *